(12) United States Patent  (10) Patent No.: US 11,699,675 B2
Liang et al.  (45) Date of Patent: Jul. 11, 2023

(54) SEMICONDUCTOR DEVICE WITH HIGH HEAT DISSIPATION EFFICIENCY

(71) Applicant: HARVATEK CORPORATION, Hsinchu (TW)

(72) Inventors: Chin-Jui Liang, Hsinchu (TW); Hui-Yen Huang, Hsinchu (TW); Ping-Lung Wang, Hsinchu (TW)

(73) Assignee: HARVATEK CORPORATION, Hsinchu (TW)

( * ) Notice: Subject to any disclaimer, the term of this patent is extended or adjusted under 35 U.S.C. 154(b) by 114 days.

(21) Appl. No.: 17/385,936

(22) Filed: Jul. 27, 2021

(65) Prior Publication Data

US 2022/0359451 A1 Nov. 10, 2022

(30) Foreign Application Priority Data

May 7, 2021 (TW) .................................. 110116485

(51) Int. Cl.
*H01L 23/00* (2006.01)
*H01L 23/367* (2006.01)
*H01L 23/31* (2006.01)

(52) U.S. Cl.
CPC .......... *H01L 24/32* (2013.01); *H01L 23/3135* (2013.01); *H01L 23/367* (2013.01); *H01L 24/29* (2013.01); *H01L 24/83* (2013.01); *H01L 2224/29022* (2013.01); *H01L 2224/3226* (2013.01); *H01L 2224/83192* (2013.01); *H01L 2224/83856* (2013.01)

(58) Field of Classification Search
None
See application file for complete search history.

(56) References Cited

U.S. PATENT DOCUMENTS

| 11,024,556 | B2 | 6/2021 | Kwon et al. | |
| 11,043,440 | B2 | 6/2021 | Kim et al. | |
| 2003/0071348 | A1* | 4/2003 | Eguchi | H01L 23/42 257/E23.092 |
| 2008/0237840 | A1* | 10/2008 | Alcoe | H01L 23/42 257/706 |

(Continued)

FOREIGN PATENT DOCUMENTS

| TW | 202046467 A | 12/2020 |
| TW | 202103277 A | 1/2021 |

*Primary Examiner* — Michelle Mandala
*Assistant Examiner* — Jordan M Klein
(74) *Attorney, Agent, or Firm* — Li & Cai Intellectual Property Office

(57) ABSTRACT

A semiconductor device with high heat dissipation efficiency includes a base structure, a semiconductor chip, a heat dissipating structure, and a package body. The semiconductor chip is disposed on the base structure and has a first surface distant from the base structure. The heat dissipating structure includes a buffer layer and a first heat spreader. The buffer layer is disposed on the first surface of the semiconductor chip and a coverage rate thereof on the first surface is at least 10%. The first heat spreader is disposed on the buffer layer and bonded to the first surface of the semiconductor chip through the buffer layer. The package body encloses the semiconductor chip and the heat dissipating structure, and the package body and the buffer layer have the same heat curing temperature.

14 Claims, 10 Drawing Sheets

(56) References Cited

U.S. PATENT DOCUMENTS

| | | | |
|---|---|---|---|
| 2015/0187679 A1* | 7/2015 | Ho | H01L 23/433 438/118 |
| 2020/0273718 A1 | 8/2020 | Cheng et al. | |
| 2021/0043590 A1 | 2/2021 | Hsu et al. | |
| 2021/0160997 A1* | 5/2021 | Kirkpatrick | H01L 23/3677 |
| 2022/0020659 A1* | 1/2022 | Zheng | H01L 23/3737 |

\* cited by examiner

SEMICONDUCTOR DEVICE WITH HIGH HEAT DISSIPATION EFFICIENCY

CROSS-REFERENCE TO RELATED PATENT APPLICATION

This application claims the benefit of priority to Taiwan Patent Application No. 110116485, filed on May 7, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a semiconductor device, and more particularly to a semiconductor device with high heat dissipation efficiency.

BACKGROUND OF THE DISCLOSURE

Electronic products such as smart phones and notebook computers rely upon semiconductor chips of various functions for operation, and the semiconductor chips must be packaged into components before being used in the electronic products. A semiconductor package can serve as a carrier or a casing that encloses one or more semiconductor chips, and can protect the semiconductor chips, provide electrical paths, and manage heat dissipation.

With the advancement of technology and the increase of market requirements, electronic products continue to develop toward high performance, high speed and miniaturization. This will lead to an increase in layout density of a semiconductor component and cause heat to be concentrated in package structures that are decreasing in size. If the heat cannot be removed at a sufficient rate, the semiconductor component may be damaged due to an increased temperature. Therefore, how to enable the electronic products to have good heat dissipation efficiency under a limited component volume, so as to ensure the normal operation of the electronic products and extend the lifespan of the products, has become a key problem that electronic products must overcome.

Therefore, in the current package structure, a heat sink is often provided on the semiconductor chip to transfer heat to the outside of the package structure by configuring the heat sink to be in contact with the air.

SUMMARY OF THE DISCLOSURE

In response to the above-referenced technical inadequacies, the present disclosure provides a semiconductor device with high heat dissipation efficiency, which can effectively address issues relating to heat dissipation in current mainstream electronic products.

In one aspect, the present disclosure provides a semiconductor device with high heat dissipation efficiency, which includes a base structure, a semiconductor chip, a heat dissipating structure, and a package body. The semiconductor chip is disposed on the base structure and has a first surface distant from the base structure. The heat dissipating structure includes a buffer layer and a first heat spreader. The buffer layer is disposed on the first surface of the semiconductor chip and a coverage rate thereof on the first surface is at least 10%. The first heat spreader is disposed on the buffer layer and bonded to the first surface of the semiconductor chip through the buffer layer. The package body encloses the semiconductor chip and the heat dissipating structure, and the package body and the buffer layer have a same heat curing temperature.

In one embodiment of the present disclosure, the heat curing temperature of each of the package body and the buffer layer is from 120° C. to 200° C.

In one embodiment of the present disclosure, the first heat spreader has a first embedded portion and a first exposed portion. The first embedded portion is embedded in the buffer layer and is in contact with the first surface of the semiconductor chip. The first exposed portion is exposed outside of the buffer layer.

In one embodiment of the present disclosure, the buffer layer includes a plurality of buffer protrusions spaced apart from each other, and the first embedded portion of the first heat spreader is located in one or more gaps defined between the buffer protrusions.

In one embodiment of the present disclosure, the buffer protrusions are arranged into an M×N array, where M and N are each an integer greater than 1.

In one embodiment of the present disclosure, the buffer layer is in the form of a frame having a cavity, and the first embedded portion of the first heat spreader is located in the cavity.

In one embodiment of the present disclosure, the buffer layer is a mesh structure having a plurality of cavities, and the first embedded portion of the first heat spreader is located in the cavities.

In one embodiment of the present disclosure, no air gaps are present between the buffer layer and the first heat spreader.

In one embodiment of the present disclosure, the base structure includes a carrier and a second heat spreader disposed on the carrier. The semiconductor chip further includes a second surface that is close to the base structure and opposite to the first surface. A portion of the second heat spreader is in contact with the second surface of the semiconductor chip.

In one embodiment of the present disclosure, the second heat spreader has a second embedded portion and a second exposed portion. The second embedded portion is embedded in the carrier. The second exposed portion is exposed outside of the carrier and is in contact with the second surface of the semiconductor chip.

In one embodiment of the present disclosure, the package body and the buffer layer have a same thermal expansion coefficient.

In one embodiment of the present disclosure, the thermal expansion coefficient of each of the package body and the buffer layer is from 10 ppm/° C. to 100 ppm/° C.

In one embodiment of the present disclosure, the buffer layer has a thickness from 10 μm to 200 μm, and the first heat spreader has a thickness from 20 μm to 300 μm.

One of the beneficial effects of the subject matter provided by the present disclosure is that, the semiconductor device with high heat dissipation efficiency can solve the heat dissipation problem of an electronic product to ensure normal operation of the electronic product, thereby extending the lifespan of the electronic product, by virtue of "the heat dissipating structure including a buffer layer and a first heat spreader, the buffer layer being disposed on the first surface of the semiconductor chip and a coverage rate of the buffer layer on the first surface being at least 10%, and the first heat spreader being disposed on the buffer layer and bonded to the first surface of the semiconductor chip through the buffer layer".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
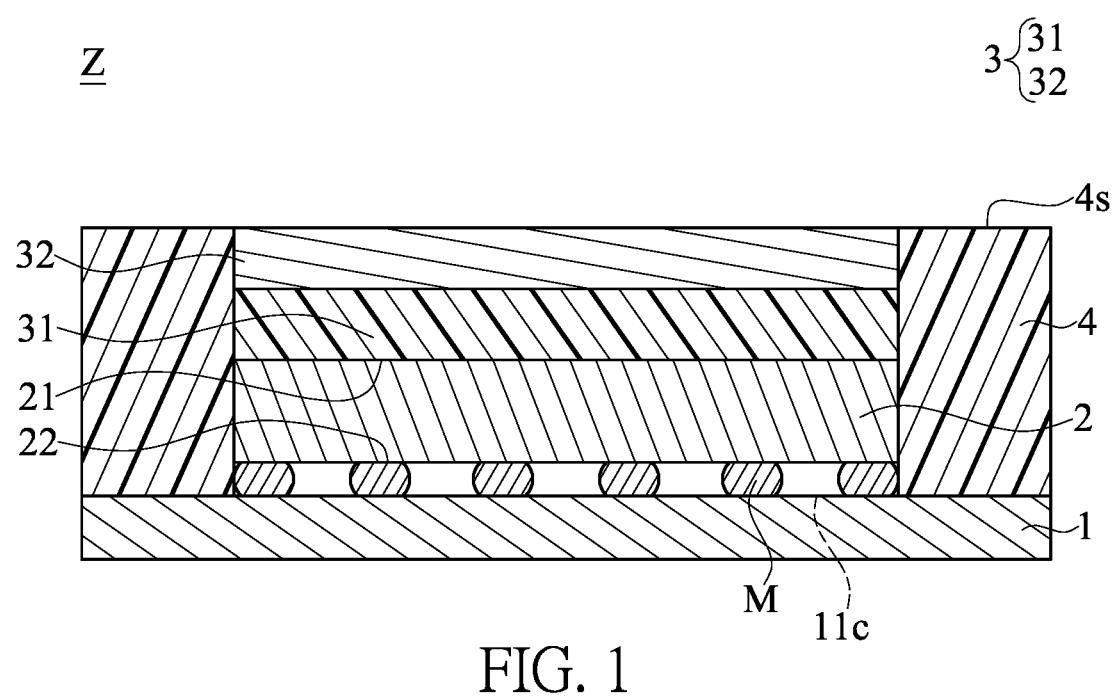
FIG. 1 is a sectional view of a semiconductor device with high heat dissipation efficiency according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

As chip design becomes more integrated and complex, an amount of heat generated in a semiconductor chip is greatly increased. If the generated heat cannot be removed in time, there may be a sharp rise in temperature of the semiconductor chip. Consequently, the work efficiency, lifespan and stability of the semiconductor chip may be reduced as a result of operating at high temperatures. Therefore, the present disclosure provides a novel technical solution for a close and reliable contact between the semiconductor chip and a heat spreader, and a semiconductor device with high heat dissipation efficiency can be thusly obtained.

First Embodiment

Figure 2:
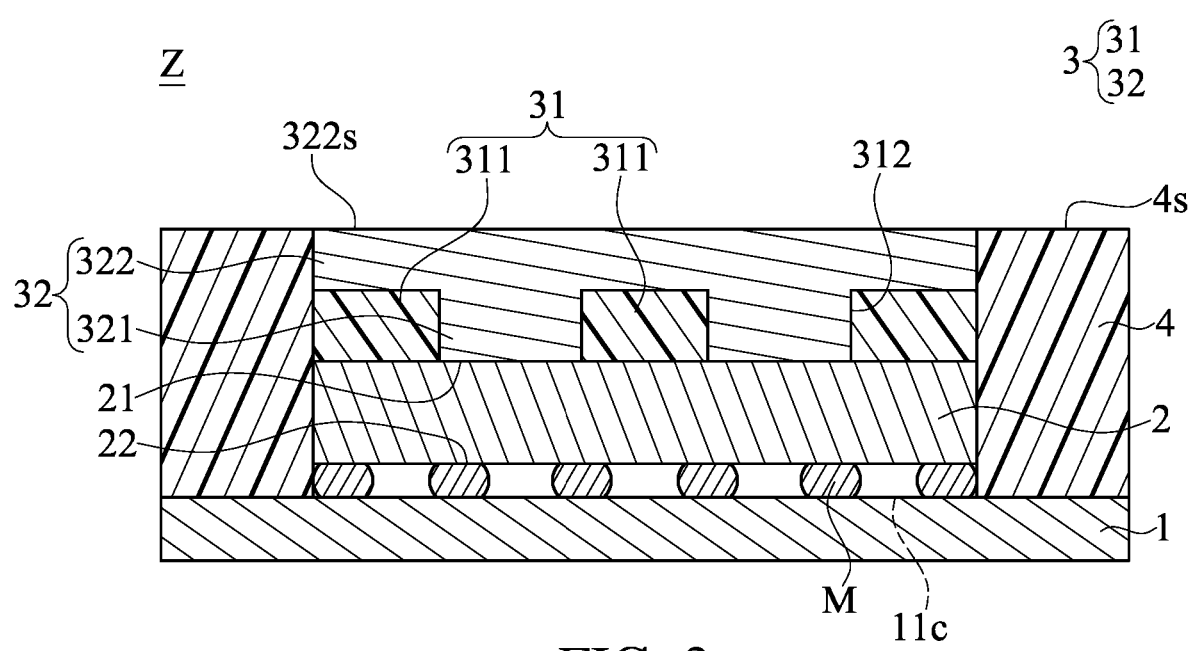
FIG. 2 is another sectional view of the semiconductor device with high heat dissipation efficiency according to the first embodiment of the present disclosure.

Referring to FIG. 1 and FIG. 2, two structures of different implementations of a semiconductor device Z with high heat dissipation efficiency according to the first embodiment of the present disclosure are shown, respectively. As shown in FIG. 1 and FIG. 2, the semiconductor device Z includes a base structure 1, a semiconductor chip 2, a heat dissipating structure 3, and a package body 4. The semiconductor chip 2 is disposed on the base structure 1. The heat dissipating structure 3 is disposed on the semiconductor chip 2. The package body 4 encloses the semiconductor chip 2 and the heat dissipating structure 3 to form a whole structure. In use, electrical signals can be applied to the semiconductor chip 2 through the base structure 1, so as to allow the semiconductor chip 2 to operate normally and perform a desired function, and heat generated by the semiconductor chip 2 can be quickly dissipated to the outside through the heat dissipating structure 3. The package body 4 can not only prevent the semiconductor chip 2 from being physically damaged, but also isolate the semiconductor chip 2 from the external environment to reduce negative impacts from environmental factors (e.g., moisture).

The details of the base structure 1, the semiconductor chip 2, the heat dissipating structure 3, and the package body 4 and the connection relationship between them are described below in conjunction with the figures of the present disclosure.

The base structure 1 can include a carrier. The carrier can be a lead frame or a substrate, and has a plurality of connecting interfaces 11c for electrically connecting the semiconductor chip 2 or an external device (not shown). The semiconductor chip 2 can be bonded to the connecting interfaces 11c of the base structure 1 by at least one conductive bonding medium M. The conductive bonding medium M can be a metal ball such as a solder ball, but is not limited thereto. The conductive bonding medium M can provide the shortest vertical interconnection path for the semiconductor chip 2, so that the semiconductor chip 2 can cooperate with the base structure 1 to perform a primary function of an electronic product to which the semiconductor chip 2 is applied. The above description is for exemplary purposes only, and is not intended to limit the scope of the present disclosure.

More specifically, the semiconductor chip 2 can be singulated from a semiconductor wafer with integrated circuits. The semiconductor wafer can be made of monocrystalline silicon, polycrystalline silicon, amorphous silicon, or an alloy compound containing an element of the third or fifth group of the Periodic Table. The semiconductor chip 2 has a first surface 21 distant from the base structure 1 and a second surface 22 close to the base structure 1. The first surface 21 serves as a main heat output surface, and the second surface 22 serves as a solderable surface.

The heat dissipating structure 3 includes a buffer layer 31 and a first heat spreader 32. The buffer layer 31 is disposed on the first surface 21 of the semiconductor chip 2. The buffer layer 31 can entirely cover the first surface 21, as shown in FIG. 1, or partially cover the first surface 21, as shown in FIG. 2. A coverage rate of the buffer layer 31 on the first surface 21 is at least 10% (i.e., from 10% to 100%), and is preferably from 10% to 90%. The first heat spreader 32 is disposed on the buffer layer 31 and bonded to the first surface 21 of the semiconductor chip 2 through the buffer layer 31. In the circumstance that the buffer layer 31 partially covers the first surface 21, a portion of the first heat spreader 32 can come into contact with the first surface 21 of the semiconductor chip 2 through the buffer layer 31. In the present embodiment, a contact area between the first heat spreader 32 and the first surface 21 is 10% or more of a total area of the first surface 21, preferably 90% or more of the total area of the first surface 21, but is not limited thereto.

It is worth mentioning that, the buffer layer 31 has high adhesion to the semiconductor chip 2 before being fully cured (i.e., in a semi-cured state), so as to allow the first heat spreader 32 to be directly adhered on the first surface 21 of the semiconductor chip 2, without forming a coated layer such as an electroplated or sputtered layer on the first surface 21 of the semiconductor chip 2. Furthermore, a semi-cured buffer layer 31 can serve as an auxiliary layer for forming the first heat spreader 32. That is, in the presence of the semi-cured buffer layer 31, the first heat spreader 32 can be formed in a more economical, fast and effective manner, and has a thickness uniformity suited to a specific purpose or application. In addition, the buffer layer 31 can provide good supporting, fixing, buffering and protecting effects on the first heat spreader 32, so that the first heat spreader 32 can be stably retained on the semiconductor chip 2.

In practice, a thickness of the buffer layer 31 can be from 10 μm to 200 μm, and a thickness of the first heat spreader 32 can be from 20 μm to 300 μm. The buffer layer 31 can be formed from a material including an epoxy or a silicone, which is exemplified by Ajinomoto build-up material. The buffer layer 31 has a heat curing temperature from 120° C. to 200° C. and a thermal expansion coefficient from 10 ppm/° C. to 100 ppm/° C. The first heat spreader 32 can be formed from one of the following metals and their alloy: gold, silver, copper, aluminum, tin and nickel. One thickness of the first heat spreader 32 on one point or area of an outer surface of the buffer layer 31 is approximately the same as another thickness of the first heat spreader 32 on another point or area of the outer surface of the buffer layer 31. The above description is only exemplary, and is not intended to limit the scope of the present disclosure.

Figure 3:
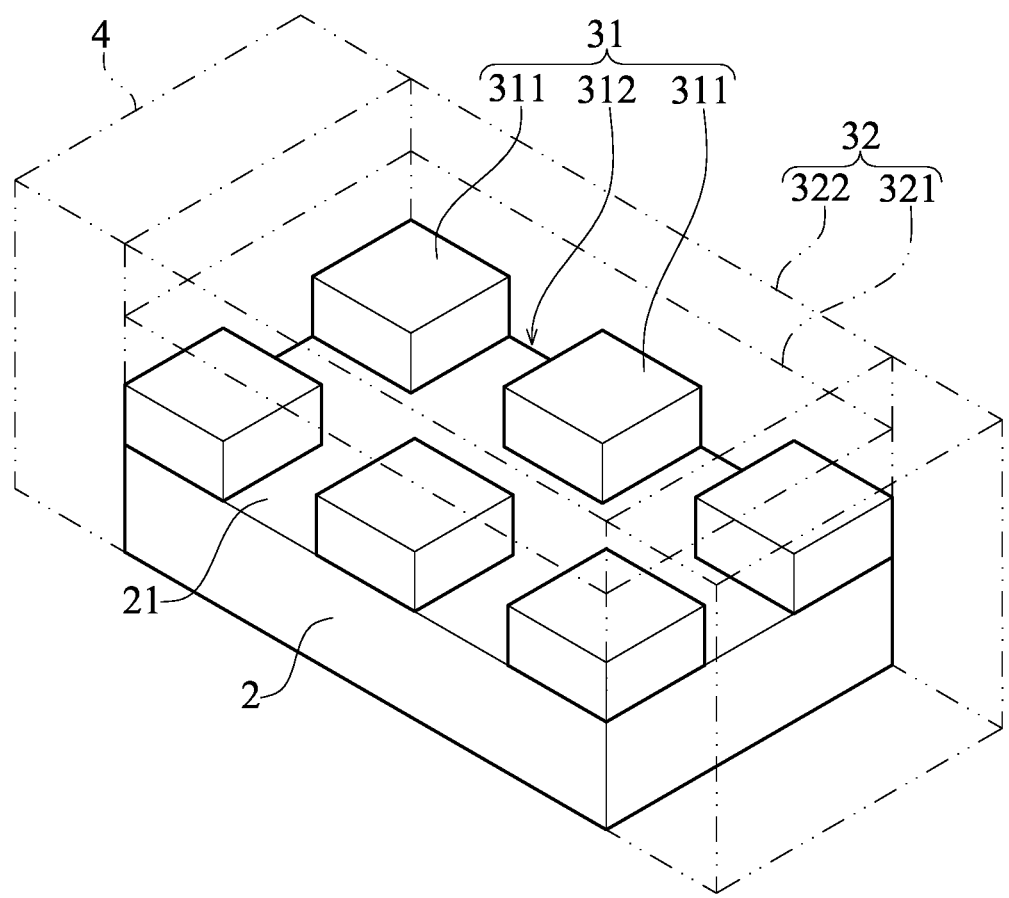
FIG. 3 is a partial perspective view of the semiconductor device with high heat dissipation efficiency according to the first embodiment of the present disclosure.
Figure 4:
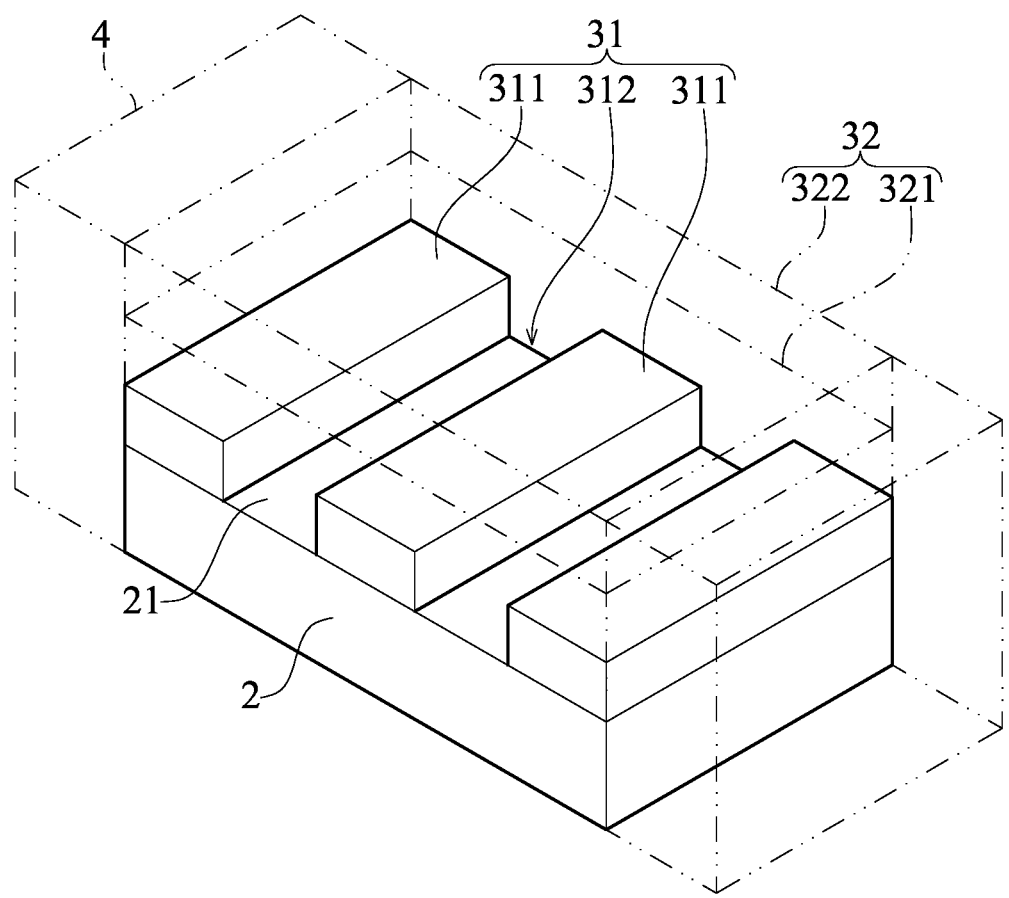
FIG. 4 is another partial perspective view of the semiconductor device with high heat dissipation efficiency according to the first embodiment of the present disclosure.

Referring to FIG. 3 and FIG. 4, more specifically, the first heat spreader 32 can have a first embedded portion 321 and a first exposed portion 322. The first embedded portion 321 is embedded in the buffer layer 31 and is in contact with the first surface 21 of the semiconductor chip 2. The first exposed portion 322 is exposed outside of the buffer layer 31. The buffer layer 31 can include a plurality of buffer protrusions 311 spaced apart from each other, and the first embedded portion 321 is located in one or more gaps 312 between the buffer protrusions 311. The buffer protrusions 311 may be in the shape of a block as shown in FIG. 3 or a strip as shown in FIG. 4, but are not limited thereto.

In certain embodiments, as shown in FIG. 3, the buffer protrusions 311 are evenly distributed on the first surface 21 of the semiconductor chip 2 and arranged into an array. Although FIG. 3 shows that the buffer protrusions 311 are 6 in quantity and arranged into a 2×3 array, in practice, the quantity and arrangement of the buffer protrusions 311 can be changed according to a desired effect. In other words, the buffer protrusions 311 can be arranged on the first surface 21 of the semiconductor chip 2 and into an M×N array, where M and N are each an integer greater than 1.

The package body 4 is formed on the base structure 1 and encloses the semiconductor chip 2 and the heat dissipating structure 3, and an outer surface 4s thereof is flush with an outer surface 322s of the first exposed portion 322 of the first heat spreader 32. It is worth mentioning that, the package body 4 and the buffer layer are formed from the same material. That is, the package body 4 and the buffer layer have the same heat curing temperature, and even have the same thermal expansion coefficient. Therefore, the buffer layer 31 that is in a semi-cured state and that carries the first heat spreader 32 can be fully cured and integrated with the package body 4 in the formation process of the package body 4, such that the first heat spreader 32 can be stably retained on the semiconductor chip 2 and maintain a close and reliable contact with the first surface 21.

Figure 5:
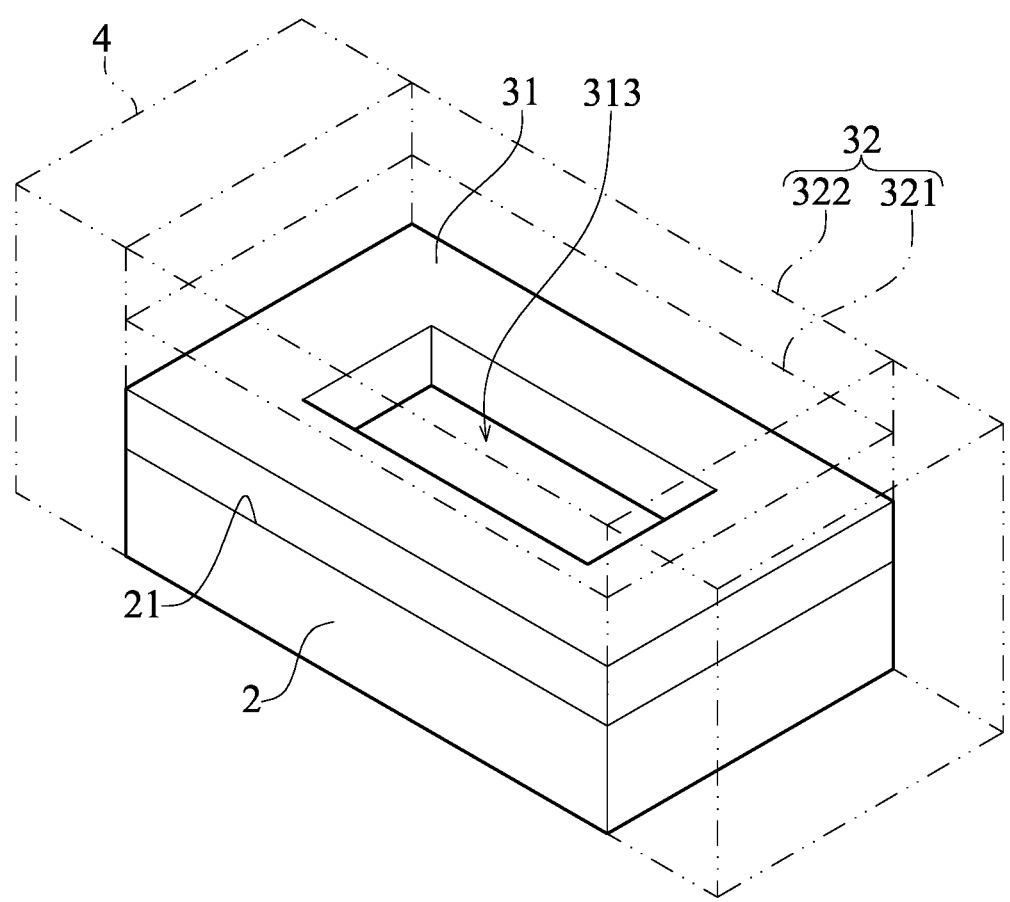
FIG. 5 is yet another partial perspective view of the semiconductor device with high heat dissipation efficiency according to the first embodiment of the present disclosure.
Figure 6:
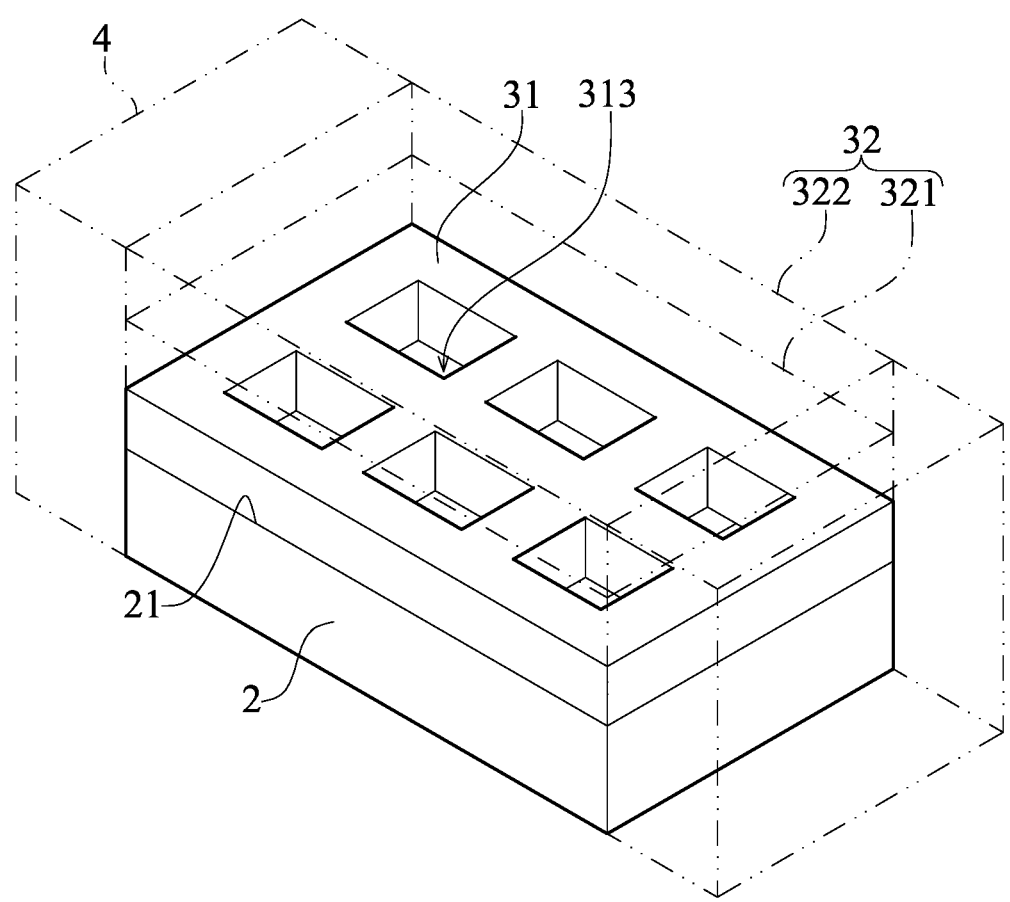
FIG. 6 is still another partial perspective view of the semiconductor device with high heat dissipation efficiency according to the first embodiment of the present disclosure.

Referring to FIG. 4 and FIG. 5, in practice, the buffer layer 31 can be in the form of a frame having a cavity 313, and the first embedded portion 321 of the first heat spreader 32 is located in the cavity 313. Also, the buffer layer 31 can be a mesh structure having a plurality of cavities 313, and the first embedded portion 321 of the first heat spreader 32 is located in the cavities 313.

Second Embodiment

Figure 7:
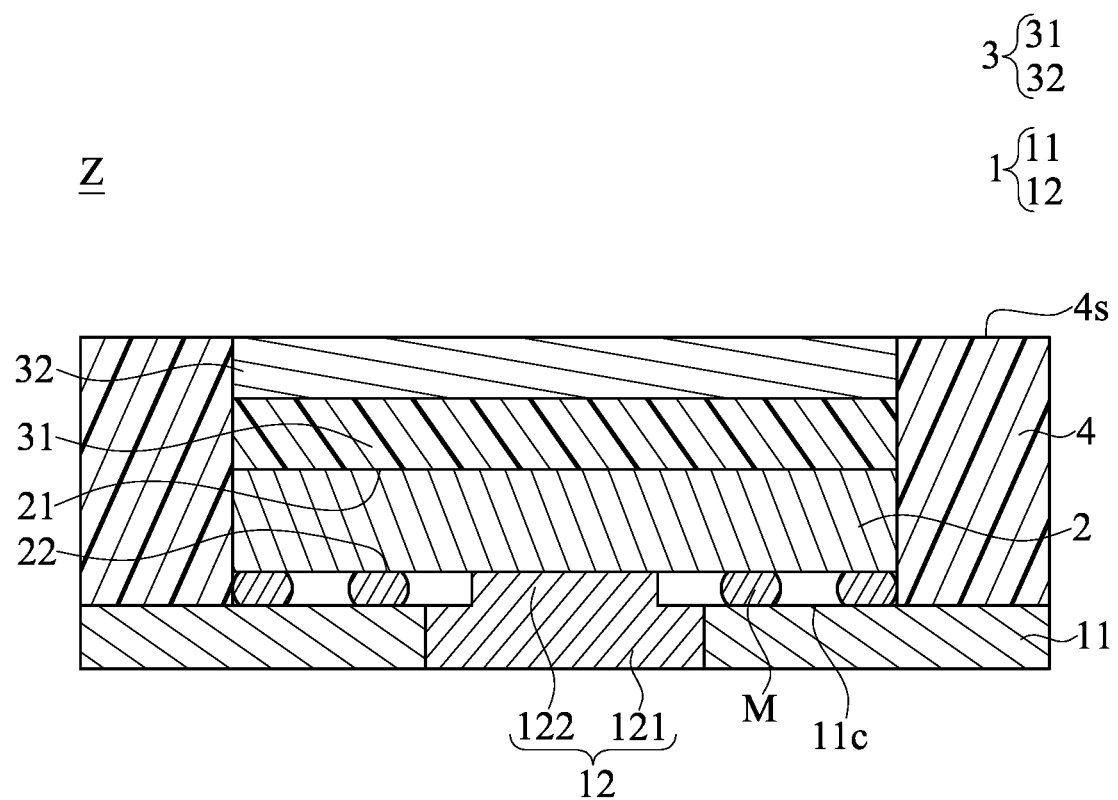
FIG. 7 is a sectional view of a semiconductor device with high heat dissipation efficiency according to a second embodiment of the present disclosure.
Figure 8:
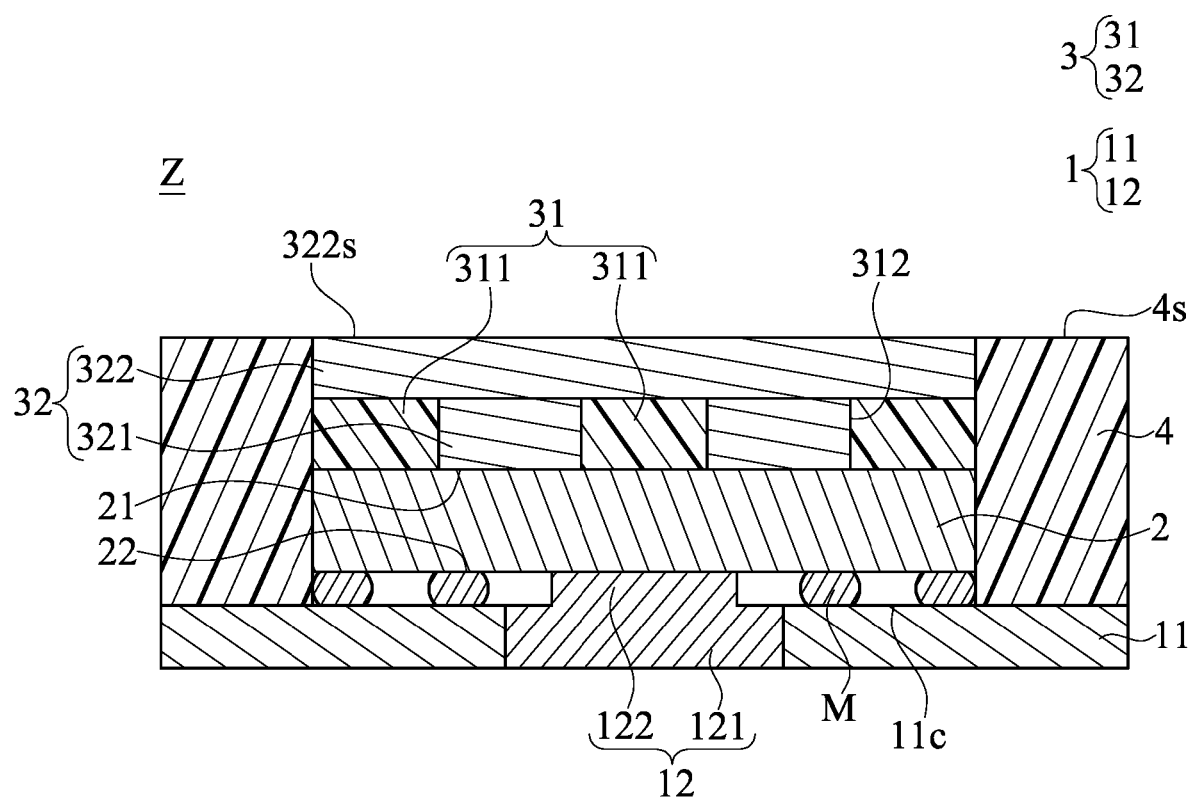
FIG. 8 is another sectional view of the semiconductor device with high heat dissipation efficiency according to the second embodiment of the present disclosure.

Referring to FIG. 7 and FIG. 8, two structures of different implementations of a semiconductor device Z with high heat dissipation efficiency according to the second embodiment of the present disclosure are shown, respectively. As shown in FIG. 7 and FIG. 8, the semiconductor device Z includes a base structure 1, a semiconductor chip 2, a heat dissipating structure 3, and a package body 4. The semiconductor chip 2 is disposed on the base structure 1. The heat dissipating structure 3 is disposed on the semiconductor chip 2. The package body 4 encloses the semiconductor chip 2 and the heat dissipating structure 3 to form a whole structure. Furthermore, the heat dissipating structure 3 includes a buffer layer 31 and a first heat spreader 32. The buffer layer 31 is disposed on a first surface 21 of the semiconductor chip 2. The buffer layer 31 can entirely cover the first surface 21, as shown in FIG. 7, or partially cover the first surface 21, as shown in FIG. 8. A coverage rate of the buffer layer 31 on the first surface 21 is at least 10% (i.e., from 10% to 100%), and is preferably from 10% to 90%. The first heat spreader 32 is disposed on the buffer layer 31 and bonded to the first surface 21 of the semiconductor chip 2 through the buffer layer 31. In the circumstance that the buffer layer 31 partially covers the first surface 21, a portion of the first heat spreader 32 can come into contact with the first surface 21 of the semiconductor chip 2 through the buffer layer 31. The details of the base structure 1, the semiconductor chip 2, the heat dissipating structure 3, and the package body 4 and the connection relationship between them are described in the first embodiment, and will not be reiterated herein.

The main difference of the present embodiment from the first embodiment is that, the base structure 1 includes a carrier 11 (e.g., a lead frame or a substrate) and a second heat spreader 12 disposed on the carrier 11, and a portion of the second heat spreader 12 is in contact with a second surface 22 of the semiconductor chip 2. More specifically, the second heat spreader 12 has a second embedded portion 121 and a second exposed portion 122. The second embedded portion 121 is embedded in the carrier 11. The second exposed portion 122 is exposed outside of the carrier 11 and is in contact with the second surface 22 of the semiconductor chip 2. The second heat spreader 12 can be, but is not limited to being, formed from one of the following metals and their alloy: gold, silver, copper, aluminum, tin and nickel.

Figure 9:
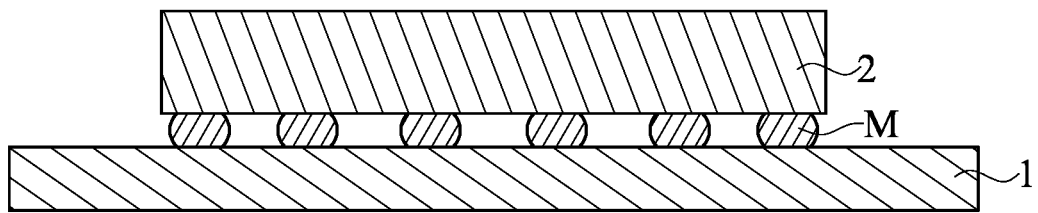
FIGS. 9 and 10 are schematic views showing a manufacturing process of the semiconductor device with high heat dissipation efficiency according to embodiments of the present disclosure.
Figure 10:
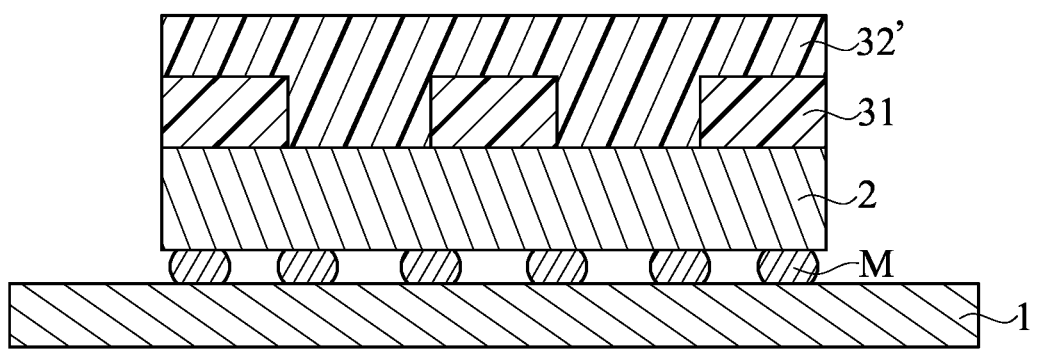

Referring to FIG. 9 and FIG. 10, which is to be read in conjunction with FIG. 1, the present disclosure further provides a method for manufacturing semiconductor device with high heat dissipation efficiency that mainly includes the following steps. Firstly, a base structure 1 is provided. Next, a semiconductor chip 2 is disposed on the base structure 1. Next, a semi-cured buffer layer 31 is used to allow a heat spreader 32' to be adhered on a first surface 21 (e.g., an upper surface) of the semiconductor chip 2, in which the heat spreader 32' is formed on the semi-cured buffer layer 31 in advance. Finally, a package body 4 is formed to enclose the semiconductor chip 2 and the semiconductor chip 2, in which the semi-cured buffer layer 31 is fully cured and integrated with the package body 4 in the formation process of the package body 4. Accordingly, the heat spreader 32' can be stably retained on the semiconductor chip 2.

Beneficial Effects of the Embodiments

One of the beneficial effects of the subject matter provided by the present disclosure is that, the semiconductor device with high heat dissipation efficiency can solve the heat dissipation problem of an electronic product to ensure normal operation of the electronic product, thereby extending the lifespan of the electronic product, by virtue of "the heat dissipating structure including a buffer layer and a first heat spreader, the buffer layer being disposed on the first surface of the semiconductor chip and a coverage rate of the buffer layer on the first surface being at least 10%, and the first heat spreader being disposed on the buffer layer and bonded to the first surface of the semiconductor chip through the buffer layer".

Furthermore, in the present disclosure, the heat spreader is directly adhered on the main heat output surface of the semiconductor chip by the buffer layer. Therefore, the heat spreader can be formed in a more economical, fast and effective manner, and has a thickness uniformity suited to a specific purpose or application. In addition, the buffer layer can provide good supporting, fixing, buffering and protecting effects on the heat spreader, so that the heat spreader can be stably retained on the semiconductor chip, and by adjusting process parameters, there can be no air gaps between the buffer layer and the first heat spreader.

In addition, the package body and the buffer layer have the same heat curing temperature, and even have the same thermal expansion coefficient. Therefore, the buffer layer can be fully cured and integrated with the package body in the formation process of the package body, such that the heat spreader can be stably retained on the semiconductor chip and maintain a close and reliable contact with the main heat output surface.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A semiconductor device with high heat dissipation efficiency, comprising:
   a base structure;
   a semiconductor chip disposed on the base structure and having a first surface distant from the base structure;
   a heat dissipating structure including a buffer layer and a first heat spreader, wherein the buffer layer is disposed on the first surface of the semiconductor chip and a coverage rate thereof on the first surface is at least 10%, and the first heat spreader is disposed on the buffer layer and bonded to the first surface of the semiconductor chip through the buffer layer; and
   a package body enclosing the semiconductor chip and the heat dissipating structure, wherein the package body and the buffer layer have a same heat curing temperature;
   wherein the first heat spreader has a first embedded portion and a first exposed portion, the first embedded portion is embedded in the buffer layer and is in contact with the first surface of the semiconductor chip, and the first exposed portion is exposed outside of the buffer layer.

2. The semiconductor device according to claim 1, wherein the heat curing temperature of each of the package body and the buffer layer is from 120° C. to 200° C.

3. The semiconductor device according to claim 1, wherein the buffer layer includes a plurality of buffer protrusions spaced apart from each other, and the first embedded portion of the first heat spreader is located in one or more gaps defined between the buffer protrusions.

4. The semiconductor device according to claim 3, wherein no air gaps are present between the buffer layer and the first heat spreader.

5. The semiconductor device according to claim 3, wherein the buffer protrusions are arranged into an M×N array, where M and N are each an integer greater than 1.

6. The semiconductor device according to claim 5, wherein no air gaps are present between the buffer layer and the first heat spreader.

7. The semiconductor device according to claim 1, wherein the buffer layer is in the form of a frame having a cavity, and the first embedded portion of the first heat spreader is located in the cavity.

8. The semiconductor device according to claim 7, wherein no air gaps are present between the buffer layer and the first heat spreader.

9. The semiconductor device according to claim 1, wherein the buffer layer is a mesh structure having a plurality of cavities, and the first embedded portion of the first heat spreader is located in the cavities.

10. The semiconductor device according to claim 9, wherein between the buffer layer and the first heat spreader there are no air gaps.

11. The semiconductor device according to claim 1, wherein the base structure includes a carrier and a second heat spreader disposed on the carrier, the semiconductor chip further includes a second surface that is close to the base structure and opposite to the first surface, and a portion of the second heat spreader is in contact with the second surface of the semiconductor chip.

12. The semiconductor device according to claim 11, wherein the second heat spreader has a second embedded portion and a second exposed portion, the second embedded portion is embedded in the carrier, and the second exposed portion is exposed outside of the carrier and is in contact with the second surface of the semiconductor chip.

13. The semiconductor device according to claim 1, wherein the package body and the buffer layer have a same thermal expansion coefficient.

14. The semiconductor device according to claim 13, wherein the thermal expansion coefficient of each of the package body and the buffer layer is from 10 ppm/° C. to 100 ppm/° C.

* * * * *